United States Patent
Hueste

(10) Patent No.: US 9,370,838 B2
(45) Date of Patent: Jun. 21, 2016

(54) WAVE SOLDERING NOZZLE SYSTEM AND METHOD OF WAVE SOLDERING

(71) Applicant: Illinois Tool Works Inc., Glenview, IL (US)

(72) Inventor: Gregory Leo Hueste, Camdenton, MO (US)

(73) Assignee: Illinois Tool Works Inc., Glenview, IL (US)

( * ) Notice: Subject to any disclaimer, the term of this patent is extended or adjusted under 35 U.S.C. 154(b) by 140 days.

(21) Appl. No.: 14/465,559

(22) Filed: Aug. 21, 2014

(65) Prior Publication Data

US 2016/0052074 A1 Feb. 25, 2016

(51) Int. Cl.
| | |
|---|---|
| B23K 31/02 | (2006.01) |
| B23K 3/06 | (2006.01) |
| B23K 1/00 | (2006.01) |
| H05K 3/34 | (2006.01) |
| H05K 13/04 | (2006.01) |
| B23K 1/08 | (2006.01) |

(52) U.S. Cl.
CPC ............ *B23K 3/0653* (2013.01); *B23K 1/0016* (2013.01); *B23K 1/085* (2013.01); *B23K 3/0676* (2013.01); *H05K 3/34* (2013.01); *H05K 3/3489* (2013.01); *H05K 13/0465* (2013.01); *H05K 2203/044* (2013.01)

(58) Field of Classification Search
None
See application file for complete search history.

(56) References Cited

U.S. PATENT DOCUMENTS

| | | | | |
|---|---|---|---|---|
| 3,096,566 | A | * 7/1963 | Jepson | B22D 19/0045 164/112 |
| 3,151,592 | A | * 10/1964 | Wegener | B23K 1/002 222/205 |
| 4,208,002 | A | 6/1980 | Comerford et al. | |
| 4,530,457 | A | 7/1985 | Down | |
| 4,530,458 | A | * 7/1985 | Kondo | B23K 3/0653 228/180.1 |
| 4,566,624 | A | 1/1986 | Comerford | |
| 4,632,291 | A | 12/1986 | Rahn et al. | |
| 4,666,077 | A | 5/1987 | Rahn et al. | |
| 4,684,056 | A | 8/1987 | Deambrosio | |

(Continued)

FOREIGN PATENT DOCUMENTS

| | | |
|---|---|---|
| CH | 706925 A1 * | 3/2014 |
| CN | 203409386 U * | 1/2014 |

(Continued)

OTHER PUBLICATIONS
IBM Technical Disclosure Bulletin NA9109315, Sep. 1991.*

(Continued)

*Primary Examiner* — Kiley Stoner
(74) *Attorney, Agent, or Firm* — Lando & Anastasi, LLP

(57) ABSTRACT

A wave soldering machine includes a housing and a conveyor coupled to the housing. The conveyor is configured to deliver a printed circuit board through the housing. The wave soldering machine further includes a wave soldering station coupled to the housing. The wave soldering station includes a reservoir of solder material, and a wave solder nozzle system adapted to create a solder wave. The wave solder nozzle system has a nozzle frame, and a nozzle plate secured to the nozzle frame. The nozzle plate includes a first zone of openings positioned adjacent a leading edge of the nozzle plate, a second zone of openings positioned proximate a middle of the nozzle plate, and a third zone having no openings positioned adjacent a trailing edge of the nozzle plate.

11 Claims, 5 Drawing Sheets

(56) References Cited

U.S. PATENT DOCUMENTS

| | | | |
|---|---|---|---|
| 4,802,617 A | 2/1989 | Deambrosio | |
| 4,886,201 A | 12/1989 | Deambrosio et al. | |
| 4,900,507 A * | 2/1990 | Shallenberger | G21C 3/32 376/313 |
| RE33,197 E | 4/1990 | Deambrosio | |
| 5,009,839 A * | 4/1991 | King | G21C 3/32 138/37 |
| 5,044,542 A | 9/1991 | Deambrosio | |
| 5,069,380 A | 12/1991 | Deambrosio | |
| 5,121,874 A | 6/1992 | Deambrosio et al. | |
| 5,125,556 A | 6/1992 | Deambrosio | |
| 5,156,324 A * | 10/1992 | Hueste | B23K 1/085 228/180.1 |
| 5,162,082 A | 11/1992 | Elliott | |
| 5,203,489 A | 4/1993 | Gileta et al. | |
| 5,228,614 A | 7/1993 | Elliott et al. | |
| 5,230,460 A | 7/1993 | Deamborsio et al. | |
| 5,232,562 A | 8/1993 | Elliott | |
| 5,240,169 A | 8/1993 | Gileta | |
| 5,292,055 A | 3/1994 | Gileta | |
| 5,361,969 A | 11/1994 | Gileta | |
| 5,397,049 A | 3/1995 | Gileta et al. | |
| 5,568,894 A | 10/1996 | Gileta | |
| 5,577,658 A | 11/1996 | Bailey et al. | |
| 5,818,479 A * | 10/1998 | Reinecke | B41J 2/1404 347/47 |
| 6,206,499 B1 * | 3/2001 | Iijima | B41J 2/14024 347/20 |
| 6,257,482 B1 * | 7/2001 | Koshi | B23K 3/0653 228/260 |
| 6,341,842 B1 * | 1/2002 | Beach | B41J 2/1433 347/45 |
| 6,415,972 B1 | 7/2002 | Leap | |
| 6,431,431 B2 | 8/2002 | Willis et al. | |
| 6,592,017 B2 | 7/2003 | Morris et al. | |
| 6,726,083 B2 | 4/2004 | Leap | |
| 6,913,183 B2 | 7/2005 | Becker et al. | |
| 7,213,738 B2 | 5/2007 | Ludwig et al. | |
| 8,162,460 B2 * | 4/2012 | Amma | B41J 2/17513 347/43 |
| 2004/0060969 A1 * | 4/2004 | Imai | B23K 1/0016 228/180.21 |
| 2004/0211816 A1 * | 10/2004 | Ogawa | B23K 1/085 228/37 |
| 2005/0001877 A1 * | 1/2005 | Chikanawa | B41J 2/1433 347/42 |
| 2005/0185018 A1 * | 8/2005 | Silverbrook | B41J 2/14 347/40 |
| 2007/0076054 A1 * | 4/2007 | Sugahara | B41J 2/14233 347/47 |
| 2008/0043058 A1 * | 2/2008 | Silverbrook | B41J 2/155 347/42 |
| 2008/0189947 A1 * | 8/2008 | Ohta | B41J 2/1433 29/890.1 |
| 2008/0302861 A1 | 12/2008 | Szymanowski et al. | |
| 2008/0316266 A1 * | 12/2008 | Silverbrook | B41J 2/14427 347/47 |
| 2009/0050674 A1 * | 2/2009 | Zen | B23K 3/0653 228/37 |
| 2010/0065610 A1 | 3/2010 | Szymanowski | |
| 2010/0163599 A1 * | 7/2010 | Zen | B23K 3/0653 228/37 |
| 2011/0226843 A1 * | 9/2011 | Yanaros | B23K 1/0008 228/260 |
| 2011/0244411 A1 * | 10/2011 | Rochat | F23D 14/10 431/354 |
| 2011/0277268 A1 * | 11/2011 | Okamoto | B08B 1/007 15/320 |
| 2012/0006886 A1 * | 1/2012 | Sato | B23K 1/085 228/260 |
| 2012/0113189 A1 * | 5/2012 | Kobayashi | B41J 2/14233 347/40 |
| 2012/0205468 A1 * | 8/2012 | Hsieh | B05B 17/0646 239/548 |
| 2012/0212540 A1 * | 8/2012 | Dietl | B41J 2/14024 347/29 |
| 2014/0138125 A1 * | 5/2014 | Iwase | H05K 1/092 174/251 |
| 2014/0139587 A1 * | 5/2014 | Hildebrand | B41J 2/16544 347/28 |
| 2014/0209661 A1 | 7/2014 | Hsieh | |
| 2015/0191390 A1 * | 7/2015 | Singer | B23K 31/02 65/499 |
| 2015/0273847 A1 * | 10/2015 | Mizuno | B41J 2/17563 347/93 |
| 2016/0052314 A1 * | 2/2016 | Van Den Heuvel | B41J 29/38 347/14 |

FOREIGN PATENT DOCUMENTS

| | | |
|---|---|---|
| DE | 202007017553 U1 | 5/2008 |
| DE | 202009010159 U1 * | 2/2011 |
| JP | 06-184894 A * | 7/1994 |
| JP | 2011-146638 A * | 7/2011 |

OTHER PUBLICATIONS

Notification of Transmittal of the International Search Report and the Written Opinion of the International Searching Authority from corresponding PCT/US2015/039899 dated Nov. 3, 2015.

* cited by examiner

WAVE SOLDERING NOZZLE SYSTEM AND METHOD OF WAVE SOLDERING

BACKGROUND OF DISCLOSURE

1. Field of Disclosure

The present disclosure relates generally to apparatus and methods for manufacturing printed circuit boards and for assisting a process of soldering metals to integrated circuit boards, and more particularly to a wave soldering machine and related method having an improved wave solder nozzle system adapted to better control the flow of solder when performing a solder application on a printed circuit board.

2. Discussion of Related Art

In the fabrication of printed circuit boards, electronic components can be mounted to a printed circuit board by a process known as "wave soldering." In a typical wave solder machine, a printed circuit board is moved by a conveyor on an inclined path past a fluxing station, a pre-heating station, and finally a wave soldering station. At the wave soldering station, a wave of solder is caused to well upwardly (by means of a pump) through a wave solder nozzle and contact portions of the printed circuit board to be soldered.

For some time, the wave solder industry has been moving from tin/lead-based low melting point solders to lead-free higher melting temperature solders. The solder melting temperatures and processing temperatures are not able to be raised an equivalent level due to the temperature limits of the electronic devices being soldered. Utilization of solder pots and nozzles designed and optimized for tin/lead solders create limitations when applied to lead-free wave soldering. Conveyor speeds must be run slower with the lead-free solders to achieve an adequate solder joint reducing productivity and increasing defects. Additionally, thicker and thicker circuit board substrates are being developed that require additional heat and processing time. A better solution is desired to provide a solder nozzle system optimized for lead-free use.

SUMMARY OF DISCLOSURE

One aspect of the present disclosure is directed to a wave soldering machine to perform a wave soldering operation on a printed circuit board. In one embodiment, the wave soldering machine comprises a housing and a conveyor coupled to the housing. The conveyor is configured to deliver a printed circuit board through the housing. The wave soldering machine further comprises a wave soldering station coupled to the housing. The wave soldering station includes a reservoir of solder material, and a wave solder nozzle system adapted to create a solder wave. The wave solder nozzle system has a nozzle frame, and a nozzle plate secured to the nozzle frame. The nozzle plate includes a first zone of openings positioned adjacent a leading edge of the nozzle plate, a second zone of openings positioned proximate a middle of the nozzle plate, and a third zone having no openings positioned adjacent a trailing edge of the nozzle plate.

Embodiments of the wave soldering machine further may include an exit plate coupled to the nozzle frame adjacent the trailing edge of the nozzle plate, and/or a dross box coupled to the nozzle frame adjacent the leading edge of the nozzle plate. The first zone of the nozzle plate may have less openings than the second zone. Openings of the second zone of the nozzle plate may be spaced closer together than openings of the first zone. Openings of the second zone of the nozzle plate are spaced from one another a distance of approximately 10 mm and most of the openings of the first zone are spaced from one another a distance of approximately 20 mm The first zone of the nozzle plate includes at least eight rows of openings and the second zone includes at least six rows of openings.

Another aspect of the disclosure is directed to a wave solder nozzle system adapted to deliver solder material to perform a wave soldering operation on a printed circuit board. In one embodiment, the wave solder nozzle system comprises a nozzle frame and a nozzle plate secured to the nozzle frame. The nozzle plate includes a first zone of openings positioned adjacent a leading edge of the nozzle plate, a second zone of openings positioned proximate a middle of the nozzle plate, and a third zone having no openings positioned adjacent a trailing edge of the nozzle plate.

Another aspect of the disclosure is directed to a method of improving the flow of solder material out of a wave solder nozzle system of a wave soldering machine in an inert atmosphere. In one embodiment, the method comprising: delivering solder material to a wave solder nozzle system; performing a wave soldering operation on a printed circuit board; and improving the flow of solder material over the wave solder nozzle system by providing a nozzle plate through which solder travels. The nozzle plate includes a first zone of openings positioned adjacent a leading edge of the nozzle plate, a second zone of openings positioned proximate a middle of the nozzle plate, and a third zone having no openings positioned adjacent a trailing edge of the nozzle plate.

Embodiments of the method further may include providing the first zone of the nozzle plate with less openings than the second zone. Openings of the second zone of the nozzle plate may be spaced closer together than openings of the first zone. Openings of the second zone of the nozzle plate may be spaced from one another a distance of approximately 10 mm and most of the openings of the first zone are spaced from one another a distance of approximately 20 mm The first zone of the nozzle plate may include at least eight rows of openings and the second zone includes at least six rows of openings. An increased volume of solder in the second zone equalizes the solder flow to produce an even, parallel solder wave across an entire solder contact area while maintaining a six degree, liquid, molten solder plane that is parallel to a six degree plane of the circuit board travel to maximize a circuit board contact length during the wave soldering operation.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
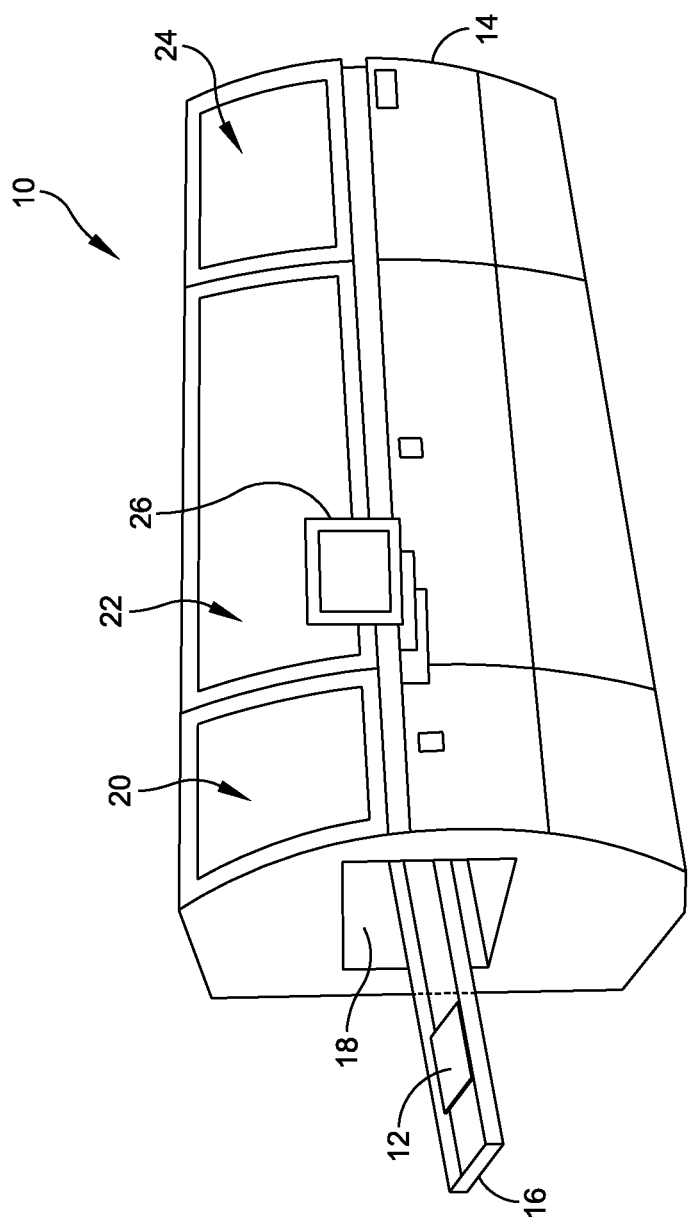
FIG. 1 is a perspective view of a wave solder machine.

This disclosure is not limited in its application to the details of construction and the arrangement of components set forth in the following description or illustrated in the drawings. The disclosure is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Embodiments of the disclosure may be directed to a wide, single wave solder nozzle system capable of achieving a solder contact time equal to or greater than traditional dual wave nozzle systems. In addition, a solder flow off an exit of the nozzle system can be controlled to create optimum solder peel off from a printed circuit board to reduce solder bridging. As used herein, the printed circuit board can be any type of electronic substrate suitable for being used in a wave soldering process. The single wave solder nozzle system eliminates the temperature drop that is seen when using a dual wave solder nozzle system. The elimination of the temperature drop increases the ability to provide better top side hole fill for lead-free applications. This also eliminates secondary exposure of the laminate and base metal to the atmosphere.

The single nozzle system of the present disclosure consists of a single flow duct and single centrifugal pump to supply solder to the nozzle. Solder flow is regulated through a perforated plate with a specifically designed, unique pattern of square holes. The perforated plate is broken up into three zones, with the hole pattern being divided into two zones. The unique hole pattern design produces an even, parallel wave across the entire solder contact area (e.g., five inches) while maintaining a six degree liquid, molten solder plane that is parallel with the six degree plane of the conveyor system conveying the circuit board.

For purposes of illustration, and with reference to FIG. 1, embodiments of the present disclosure will now be described with reference to a wave solder machine, generally indicated at 10, which is used to perform a solder application on a printed circuit board 12. The wave solder machine 10 is one of several machines in a printed circuit board fabrication/assembly line. As shown, the wave solder machine 10 includes a housing 14 adapted to house the components of the machine. The arrangement is such that a conveyor 16 delivers printed circuit boards to be processed by the wave solder machine 10. Upon entering the wave solder machine 10, each printed circuit board 12 travels along an inclined path (e.g., six degrees with respect to horizontal) along the conveyor 16 through a tunnel 18, which includes a fluxing station, generally indicated at 20, and a pre-heating station, generally indicated at 22, to condition the printed circuit board for wave soldering. Once conditioned (i.e., heated), the printed circuit board 12 travels to a wave soldering station, generally indicated at 24, to apply solder material to the printed circuit board. A controller 26 is provided to automate the operation of the several stations of the wave solder machine 10, including but not limited to the fluxing station 20, the pre-heating station 22, and the wave soldering station 24, in the well known manner.

Figure 2:
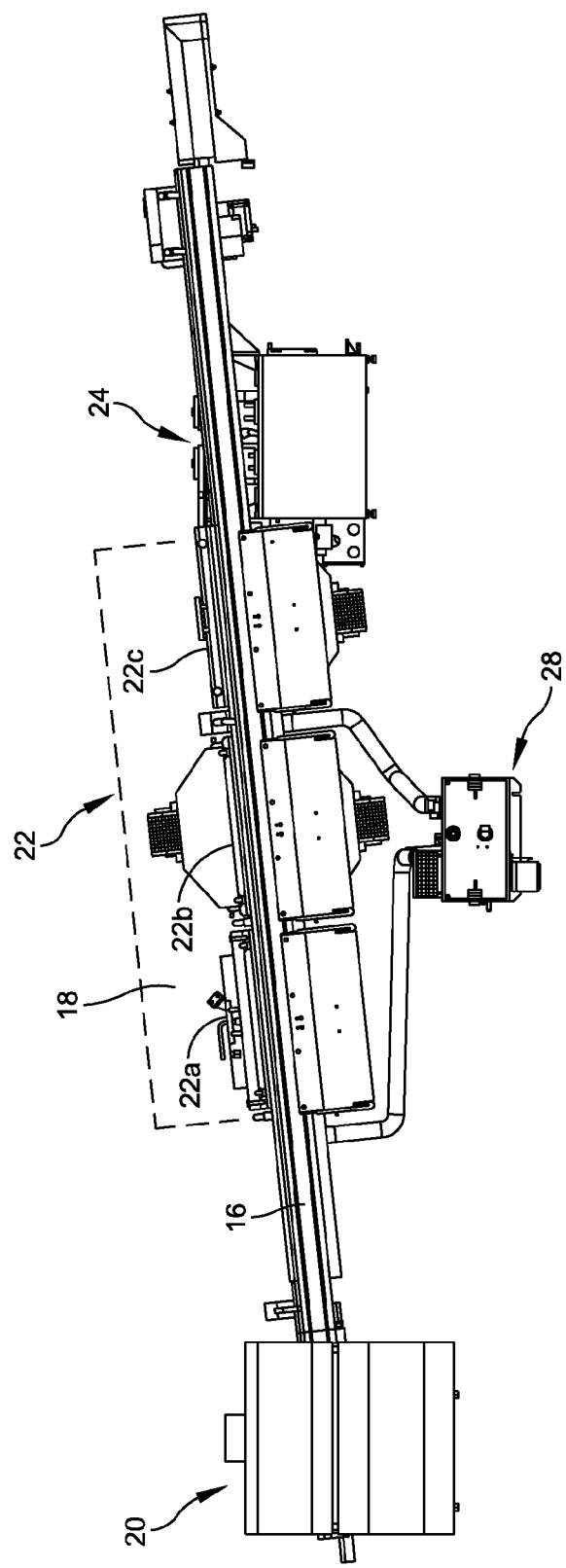
FIG. 2 is a side elevational view of the wave solder machine with external packaging removed to reveal internal components of the wave solder machine.

Referring to FIG. 2, the fluxing station 20 is configured to apply flux to the printed circuit board as it travels on the conveyor 16 through the wave solder machine 10. The pre-heating station includes several pre-heaters (e.g., pre-heaters 22a, 22b and 22c), which are designed to incrementally increase the temperature of the printed circuit board as it travels along the conveyor 16 through the tunnel 18 to prepare the printed circuit board for the wave soldering process. As shown, the wave soldering station 24 includes a wave solder nozzle system in fluid communication with a reservoir of solder material. A pump is provided within the reservoir to deliver molten solder material to the wave solder nozzle system from the reservoir. Once soldered, the printed circuit board exits the wave solder machine 10 via the conveyor 16 to another station provided in the fabrication line, e.g., a pick-and-place machine.

In some embodiments, the wave solder machine 10 further may include a flux management system, generally indicated at 28, to remove volatile contaminants from the tunnel 18 of the wave solder machine. As shown in FIG. 2, the flux management system 28 is positioned below the pre-heating station 22. In one embodiment, the flux management system is supported by a frame of the housing 14 within the wave solder machine, and is in fluid communication with the tunnel 18, which is schematically illustrated in FIG. 2. The flux management system 28 is configured to receive contaminated gas from the tunnel 18, treat the gas, and return clean gas back to the tunnel. The flux management system 28 is particularly configured to remove volatile contaminants from the gas, especially in inert atmospheres.

Figure 3:
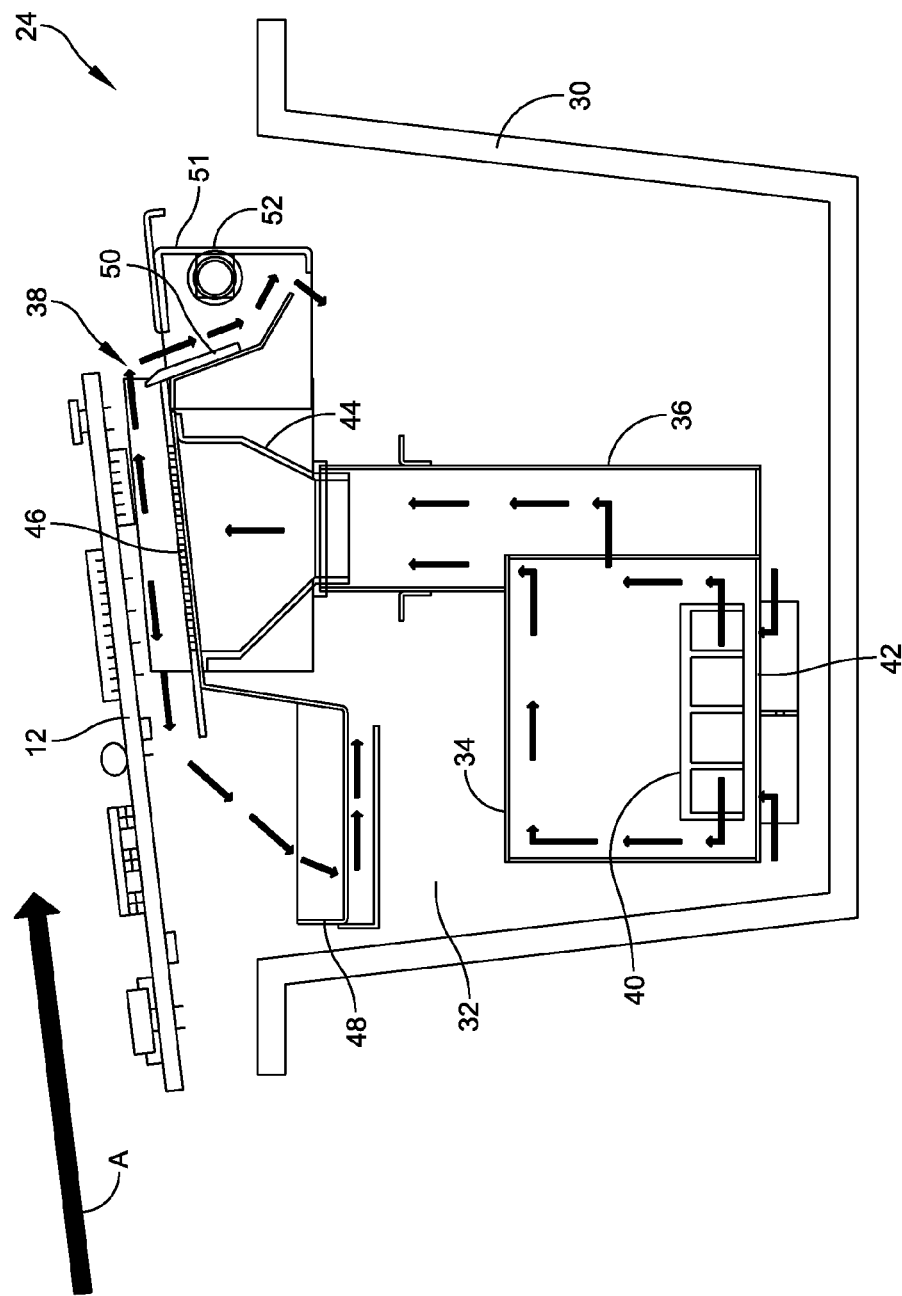
FIG. 3 is a schematic cross-sectional view of a wave soldering station of the wave solder machine.

Referring to FIG. 3, the printed circuit board 12 is shown traveling over the wave soldering station 24 with a direction of travel being indicated at A. In one embodiment, the wave soldering station 24 includes a chamber wall 30 that defines a reservoir 32 configured to contain molten solder. A flow duct having two chambers 34, 36 is positioned within the reservoir 32 and configured to deliver pressurized molten solder to a nozzle system generally indicated at 38. A pump 40 is positioned within the first chamber 34 of the flow duct adjacent an inlet 42 provided in the flow duct. In one embodiment, the pump 40 is a centrifugal pump that is suitably sized to pump the molten solder to the nozzle system 38. The nozzle system 38 is configured to generate a solder wave which is provided to attach components on the circuit board 12 in the traditional manner.

In one embodiment, the nozzle system 38 includes a nozzle frame 44 that is secured to the flow duct. A nozzle plate 46 is secured to the nozzle frame 44 in a position in which the nozzle plate maintains a six degree liquid, molten solder plane that is parallel with a six degree plane of the conveyor system 16 conveying the circuit board 12. The nozzle plate 46 is specifically configured to produce an even, parallel wave across the entire solder contact area (e.g., five inches wide). The nozzle system 38 further includes a dross box 48 that is secured to the nozzle frame 44 and configured to reduce turbulence as the solder travels back to the reservoir 32, thereby reducing solder balls that can form within the reservoir. The nozzle system 38 further includes an exit plate 50 that is secured to the nozzle frame 44 and designed to smooth the solder wave. In one embodiment, the exit plate extends into another dross box 51. One or more nitrogen tubes 52 can be provided to create an inert atmosphere during the wave soldering process.

Figure 4:
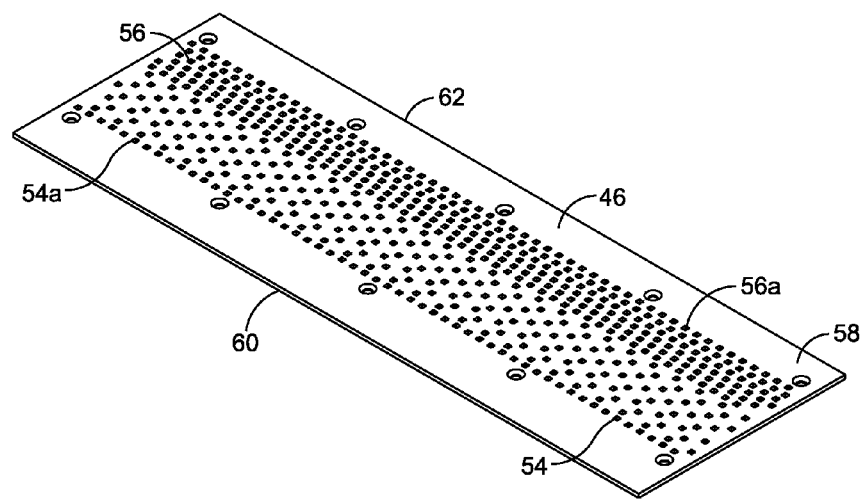
FIG. 4 is a perspective view of a nozzle plate of the wave soldering station.
Figure 5:
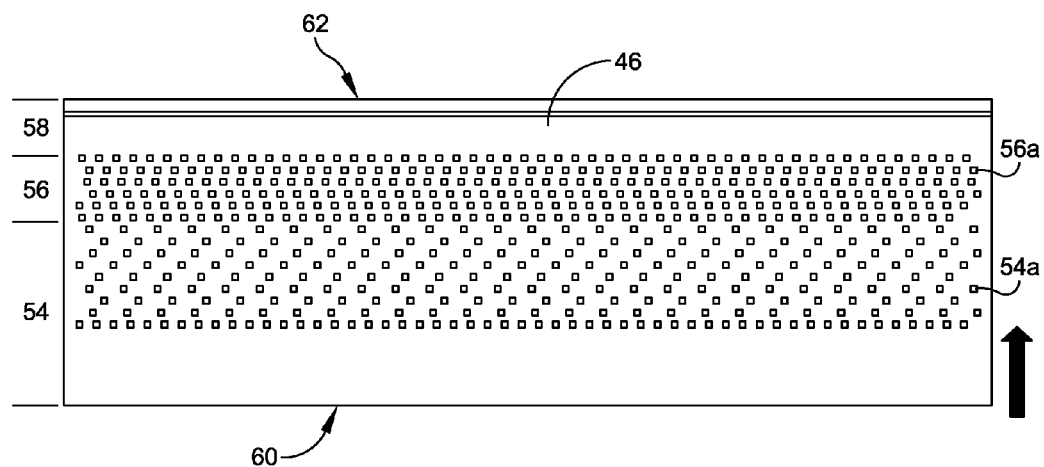
FIG. 5 is a top plan view of the nozzle plate.

As mentioned above, the single wave solder nozzle system 38 of embodiments disclosed herein is configured to create a solder contact area that is equal or greater than prior dual nozzle systems. The single nozzle system 38 of the present disclosure consists of a single flow duct (e.g., having chambers 34, 36) and single centrifugal pump (e.g., pump 40) to supply solder to the nozzle plate 46, through which molten solder travels. Solder flow is regulated through the nozzle plate 46, which is designed with a unique pattern of square holes. Referring to FIGS. 4 and 5, the nozzle plate 46 includes three zones 54, 56, 58, with a hole pattern being divided into two zones, i.e., zones 54, 56. The unique hole pattern design incorporated into the nozzle plate 46 produces an even, parallel wave across the entire solder contact area (e.g., five inches) while maintaining a six degree liquid, molten solder plane that is parallel with the six degree plane of the conveyor system 16 conveying the circuit board 12.

As shown, the first zone 54 is positioned adjacent a leading edge 60 of the nozzle plate 46. Because the nozzle plate 46 is mounted on a six degree angle, the solder pumped through holes 54a in the first zone 54 flow over holes 56a in a second zone 56. The hole pattern is altered from the leading edge 60 to the trailing edge 62. The number of holes in the pattern increases in zone 56. This increases the solder volume coming through plate 46 just past the midpoint of the plate, and continues towards the trailing edge 62 of the plate. The increased volume of solder in zone 56 helps equalize the solder flow to produce an even, parallel wave across the entire solder contact area while maintaining a six degree, liquid, molten solder plane that is parallel to the six degree plane of the conveyor system 16 transporting the circuit board 12. The increased solder volume in zone 56 also causes the solder to flow towards zone 58. This flow along with the back or exit plate 50 (FIG. 3) at the trailing edge 62 form a smooth pool of molten solder in zone 58.

The hole pattern of the first zone 54 is designed to produce a crisscrossing flow of solder towards the load end to eliminate soldering skips caused by shadowing effects of deep pocket selective soldering pallets. In one embodiment, each opening 54a is square-shaped having 3.5 millimeter (mm) sides. As shown, the first zone 54 has a first row with openings 54a that are spaced approximately 10 mm from one another from their respective center points. The first row is adjacent the leading edge 60 of the nozzle plate 46. There are eight additional rows in the first zone 54 having openings 54a that are spaced approximately 20 mm from one another from their respective center points.

The hole pattern provided in the second zone 56 is specifically designed to create individual, interstitial upward solder velocity flow that targets each individual plated through hole barrel across the entire process width of the printed circuit board 12. The hole pattern in the second zone 56 is denser than the hole pattern of the first zone 54 (i.e., openings are positioned closer together) and designed to support the solder flowing towards the entrance of the wave and create an even parallel molten solder wave. This targeted velocity flow increases the thermal transfer rate to the circuit board 12 further increasing top side hole fill performance. In one embodiment, each opening 56a is square-shaped having 3.5 mm sides. The second zone 56 includes six rows of openings 56a that are spaced approximately 10 mm from one another from their respective center points.

The third zone 58 is positioned adjacent a trailing edge 62 of the nozzle plate 46. As shown, there are no holes placed in the third zone 58 of the nozzle plate 46. Solder from the trailing holes 56a in the second zone 56 flow into the third zone 58. The exit plate 50 is placed at the trailing edge 62 of the nozzle plate 46 adjacent to the third zone 58, thereby creating a damning effect and a smooth pool of solder in the third zone. The nozzle plate 46 also regulates the flow of solder as the circuit board 12 exits the third zone 58. The third zone 58 assists in eliminating or reducing bridging defects.

The single wave solder nozzle system 38 eliminates a temperature drop that occurs to the circuit board 12 being soldered when using traditional dual wave systems. This temperature drop causes solder in the barrel openings in circuit board 12 to solidify requiring a trailing wave to re-melt the solder already deposited in the barrel of the circuit board. This has a negative impact on topside hole fill performance with dual nozzle wave configurations. The single wave nozzle system design eliminates the temperature drop by providing the same or greater contact area in the single wave that can be achieved with traditional dual wave systems. This single wave nozzle system design provides a positive impact with top side hole fill soldering performance. This is achieved by bringing the plated through hole structure in the circuit board 12 from the preheated temperature to the required soldering temperature in less than ten seconds using the additional solder contact length that the single nozzle provides.

Figure 6:
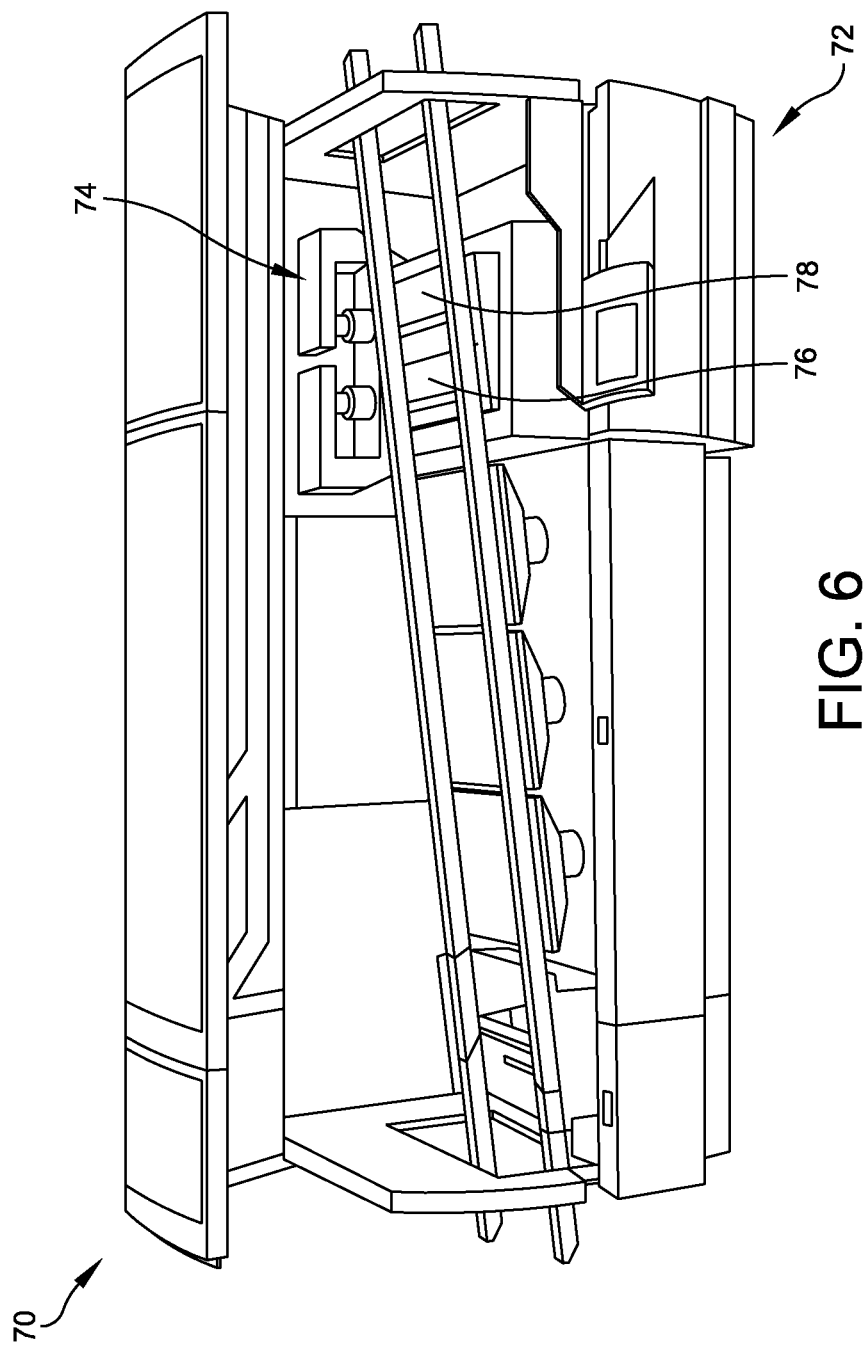
FIG. 6 is a perspective view of a wave soldering machine having a wave soldering station of another preferred embodiment.

FIG. 6 illustrates a traditional wave solder machine generally indicated at 70 that is similar in construction to wave solder machine 10. As shown, the wave solder machine 70 includes a wave soldering station generally indicated at 72 having a nozzle system generally indicated at 74 configured to generate two separate solder waves. As shown, the nozzle system 74 includes a first nozzle assembly 76 to generate a first solder wave and a second nozzle assembly 78 to generate a second solder wave.

It should be observed that the wave solder nozzle system described herein enables faster throughput speeds and lower defects when wave soldering with lead-free solder and circuit boards having higher thermal demand. Specifically, the solder nozzle system enables faster throughput for an assembly line, which reduces unit costs of the product being produced. Reduced defects eliminates or significantly reduces re-work costs and improved the quality of the product being produced.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A wave soldering machine to perform a wave soldering operation on a printed circuit board, the wave soldering machine comprising: a housing; a conveyor coupled to the housing, the conveyor being configured to deliver a printed circuit board through the housing; a wave soldering station coupled to the housing, the wave soldering station including a reservoir of solder material, and a wave solder nozzle system adapted to create a solder wave, the wave solder nozzle system having a nozzle frame, and a nozzle plate secured to the nozzle frame, the nozzle plate including a first zone of openings positioned adjacent a leading edge of the nozzle plate, a second zone of openings positioned proximate a middle of the nozzle plate, and a third zone having no openings positioned adjacent a trailing edge of the nozzle plate, the first zone, and the first zone of the nozzle plate including at least eight rows of openings and the second zone includes at least six rows of openings.

2. The wave soldering machine of claim 1, wherein openings of the second zone of the nozzle plate are spaced from one another a distance of approximately 10 mm and most of the openings of the first zone are spaced from one another a distance of approximately 20 mm.

3. The wave soldering machine of claim 1, further comprising an exit plate coupled to the nozzle frame adjacent the trailing edge of the nozzle plate.

4. The wave soldering machine of claim 3, further comprising a dross box coupled to the nozzle frame adjacent the leading edge of the nozzle plate.

5. A wave solder nozzle system adapted to deliver solder material to perform a wave soldering operation on a printed circuit board, the wave solder nozzle system comprising: a nozzle frame; and a nozzle plate secured to the nozzle frame, the nozzle plate including a first zone of openings positioned adjacent a leading edge of the nozzle plate, a second zone of openings positioned proximate a middle of the nozzle plate, and a third zone having no openings positioned adjacent a trailing edge of the nozzle plate, the first zone of the nozzle plate has less openings than the second zone, openings of the second zone of the nozzle plate being spaced closer together than openings of the first zone, and the first zone of the nozzle plate including at least eight rows of openings and the second zone includes at least six rows of openings.

6. The wave solder nozzle system of claim 5, wherein openings of the second zone of the nozzle plate are spaced from one another a distance of approximately 10 mm and most of the openings of the first zone are spaced from one another a distance of approximately 20 mm.

7. The wave solder nozzle system of claim 5, further comprising an exit plate coupled to the nozzle frame adjacent the trailing edge of the nozzle plate.

8. The wave solder nozzle system of claim 7, further comprising a dross box coupled to the nozzle frame adjacent the leading edge of the nozzle plate.

9. A method of improving the flow of solder material out of a wave solder nozzle system of a wave soldering machine in an inert atmosphere, the method comprising: delivering solder material to a wave solder nozzle system; performing a wave soldering operation on a printed circuit board; and improving the flow of solder material over the wave solder nozzle system by providing a nozzle plate through which solder travels, the nozzle plate including a first zone of openings positioned adjacent a leading edge of the nozzle plate, a second zone of openings positioned proximate a middle of the nozzle plate, and a third zone having no openings positioned adjacent a trailing edge of the nozzle plate, the first zone of the nozzle plate has less openings than the second zone, openings of the second zone of the nozzle plate being spaced closer together than openings of the first zone, and the first zone of the nozzle plate including at least eight rows of openings and the second zone includes at least six rows of openings.

10. The method of claim 9, wherein openings of the second zone of the nozzle plate are spaced from one another a distance of approximately 10 mm and most of the openings of the first zone are spaced from one another a distance of approximately 20 mm.

11. The method of claim 9, wherein an increased volume of solder in the second zone equalizes the solder flow to produce an even, parallel solder wave across an entire solder contact area while maintaining a six degree, liquid, molten solder plane that is parallel to a six degree plane of the circuit board travel to maximize a circuit board contact length during the wave soldering operation.

* * * * *